*(12)* United States Patent
Ha et al.

(10) Patent No.: US 8,742,801 B2
(45) Date of Patent: Jun. 3, 2014

(54) BUFFER CIRCUIT FOR SEMICONDUCTOR DEVICE

(71) Applicant: Samsung Electronics Co., Ltd., Suwon-si (KR)

(72) Inventors: Kyung-Soo Ha, Hwaseong-si (KR); Ho-Seok Seol, Daegu-si (KR); Woo-Jin Lee, Seoul-si (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 13/717,931

(22) Filed: Dec. 18, 2012

(65) Prior Publication Data

US 2013/0214843 A1 Aug. 22, 2013

(30) Foreign Application Priority Data

Feb. 22, 2012 (KR) .................. 10-2012-0017993

(51) Int. Cl.
*H03K 3/00* (2006.01)

(52) U.S. Cl.
USPC .............................. 327/108; 326/83; 327/333

(58) Field of Classification Search
USPC .................. 327/108–112, 333; 326/82, 83
See application file for complete search history.

(56) References Cited

U.S. PATENT DOCUMENTS

| | | | | |
|---|---|---|---|---|
| 5,105,107 A * | 4/1992 | Wilcox | ............................ | 326/68 |
| 5,491,455 A | 2/1996 | Kuo | | |
| 5,521,874 A * | 5/1996 | Sandhu | ........................ | 365/207 |
| 5,606,268 A | 2/1997 | Van Brunt | | |
| 5,613,233 A * | 3/1997 | Vagher | .......................... | 455/296 |
| 5,648,735 A * | 7/1997 | Bowers et al. | .................. | 327/65 |
| 5,821,809 A | 10/1998 | Boerstler et al. | | |
| 5,854,574 A * | 12/1998 | Singer et al. | .................. | 330/293 |
| 6,107,887 A * | 8/2000 | Zucker et al. | ................. | 330/301 |
| 6,404,281 B1 | 6/2002 | Kobayashi | | |
| 6,559,685 B2 | 5/2003 | Green | | |
| 7,400,173 B1 | 7/2008 | Kwong et al. | | |
| 7,667,916 B1 | 2/2010 | Aram | | |
| 7,965,118 B2 | 6/2011 | Seefeldt | | |
| 2003/0085737 A1* | 5/2003 | Tinsley et al. | .................. | 326/86 |
| 2007/0170987 A1 | 7/2007 | Jung et al. | | |
| 2008/0180173 A1 | 7/2008 | Nakamura | | |

OTHER PUBLICATIONS

Hamid Partovi, et al. / Single-Ended Transceiver Design Techniues for 5.33 Gb/s Graphics Application / ISSCC 2009 / Session 7 / SRAM / 7.5 / 3 pages (136~138).

* cited by examiner

*Primary Examiner* — William Hernandez
(74) *Attorney, Agent, or Firm* — Muir Patent Consulting, PLLC

(57) ABSTRACT

A buffer circuit is provided which is insensitive to a duty distortion regardless of the change of operation environment. The buffer circuit includes a current mode logic buffer and a differential-to-single-ended converter. The differential-to-single-ended converter receives first and second differential output signals to generate a single ended output signal and is configured so that an internal control node of the differential-to-single-ended converter is controlled in a negative feedback method to maintain a constant duty ratio of the single ended output signal regardless of the change of operation environment. According to some embodiments, a duty distortion of the single ended output signal due to the change of operation environment such as a process, a voltage, a temperature, etc. is reduced or minimized and thereby performance of the buffer circuit is improved and operation reliability is improved.

20 Claims, 10 Drawing Sheets

(CASE1)

(CASE2)

BUFFER CIRCUIT FOR SEMICONDUCTOR DEVICE

CROSS-REFERENCE TO RELATED APPLICATIONS

This U.S. non-provisional patent application claims priority under 35 U.S.C. §119 to Korean Patent Application No. 10-2012-0017993. filed on Feb. 22, 2012. the entire contents of which are hereby incorporated by reference.

BACKGROUND

Example embodiments relate to semiconductor devices, and more particularly, to a buffer circuit of a differential-to-single-ended type.

A buffer circuit for buffering an input signal is typically used in a semiconductor device like a dynamic random access memory.

In the case of an input buffer, a type of input signal applied from the outside may include differential input signals or pseudo differential input signals. When differential input signals are applied, an input buffer can convert the differential input signals into a single ended output signal having a CMOS full swing level. In this case, if an operation environment such as PVT (a process, a voltage, a temperature, etc.) is changed, a duty distortion of the single ended output signal may occur. If a duty ratio of the single ended output signal is not uniform, performance of the buffer circuit may be deteriorated.

SUMMARY

Example embodiments provide a semiconductor device.

According to one example embodiment, a semiconductor device may include a buffer circuit. The buffer circuit may include a first buffer, a second buffer, and an inverter. The first buffer is configured to receive first and second input signals and to generate first and second differential output signals and a common output signal having a level between an upper level of the first differential output signal and a lower level of the second differential output signal. The second buffer is configured to receive the first and second differential output signals and generate third and fourth differential output signals. The third and fourth differential output signals are fed back to an internal control node of the second buffer to drive the third and fourth differential output signals from a first voltage level to a predetermined voltage level. The inverter is configured to receive one of the third and fourth differential output signals and generate an output signal According to another embodiment, a semiconductor device may include an input buffer. The input buffer may include a current mode logic buffer, a differential-to-single-ended converter. The current mode logic buffer is configured to receive first and second input signals and to generate first and second differential output signals and a common output signal. The common output signal has a level between levels of the first and second differential output signals. The differential-to-single-ended converter includes a self-biased converting part, an inverting part. The self-biased converting part is configured to receive the first and second differential signals and to generate a first internal output signal through a load device. The inverting part is configured to generate a single ended output signal by inverting the first internal output signal. The first internal output signal is fed back to an internal control node to drive the first internal output signal from a first voltage level to a predetermined voltage level.

According to further example embodiment, a semiconductor device includes an input buffer circuit. The input buffer circuit includes a first buffer, a second buffer, and an inverter. The first buffer is configured to generate a first pair of differential output signals in response to a first pair of differential input signals. The second buffer includes an input part, a pull-up part, and a pull-down part and is configured to generate a second pair of differential output signals in response to the first pair of differential output signals through the input part. The second pair of differential output signals are fed back to the pull-up part and pull-down part through one or more resistors. The inverter is configured to generate an output signal in response to one of the second pair of differential output signals.

BRIEF DESCRIPTION OF THE FIGURES

Various example embodiments will be described below in more detail with reference to the accompanying drawings.

DETAILED DESCRIPTION OF THE EMBODIMENTS

Figure 1:
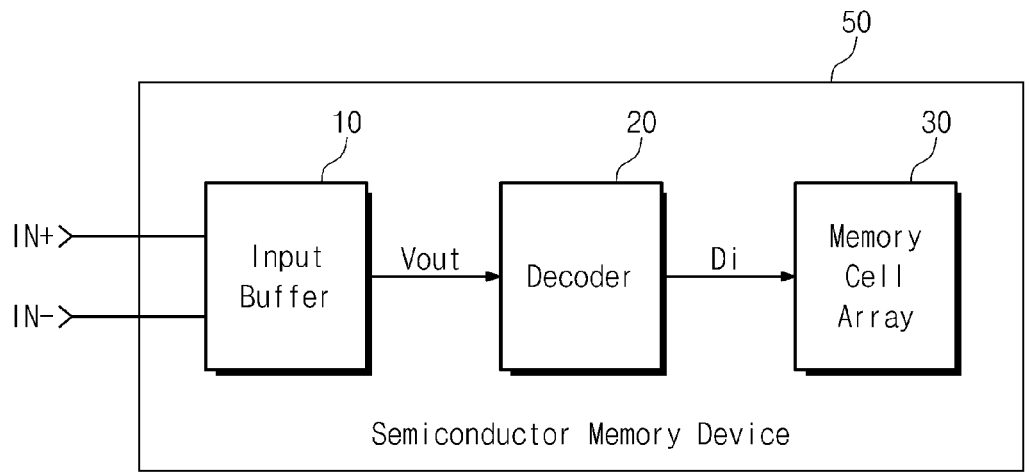
FIG. 1 is a block diagram illustrating semiconductor memory device to which an example embodiment is applied.

Various example embodiments will be described more fully hereinafter with reference to the accompanying drawings. The present disclosure may, however, be embodied in many different forms and should not be construed as limited to the embodiments set forth herein. In the drawings, the size and relative sizes of layers and regions may be exaggerated for clarity. Like numbers refer to like elements throughout.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms first, second, third, etc. may be used herein to describe various elements, components, regions, layers and/or sections, these elements, components, regions, layers and/or sections should not be limited by these terms. Unless indicated otherwise, these terms are only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating semiconductor memory device to which an example embodiment is applied.

Referring to FIG. 1, a semiconductor memory device 50 includes an input buffer 10, a decoder 20 and a memory cell array 30.

When the memory cell array 30 has an array structure in which a plurality of memory cells each comprising one access transistor and one capacitor is disposed in a matrix form of row and column, the semiconductor memory device 50 may be a DRAM.

The input buffer 10 receives a first input signal IN+ and a second input signal IN− to output an output signal Vout. The first and second input signals IN+ and IN− may be a pair of differential signals having an opposite phase. In addition, the first and second input signals IN+ and IN− may be a pair of pseudo differential signals. The pair of pseudo differential signals may include the first input signal IN+ as a reference voltage level (e.g., VDD/2) and the second input signal IN− of which a voltage level is greater than or less than the reference voltage level by a particular amount.

The decoder 20 may function as a row decoder or a column decoder. When the decoder 20 functions as a row decoder, a decoding output signal Di may be used as a signal selecting a row of the memory cell array 30.

The input buffer 10 may function as a differential-to-single-ended converter receiving differential input signals to convert them into a single ended output signal having a CMOS full swing level. Due to a change of a process, a voltage or a temperature, a duty distortion of the single ended output signal may occur. To improve performance of the input buffer circuit, an improved circuit structure reducing or minimizing a duty distortion may be used.

Figure 2:
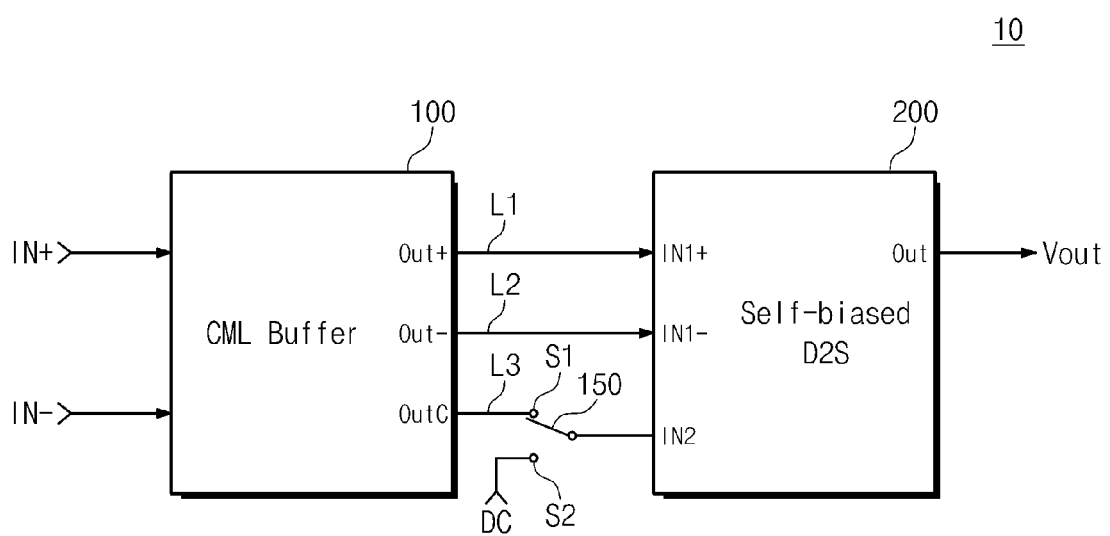
FIG. 2 is a block diagram illustrating an input buffer of FIG. 1 according to one embodiment.

FIG. 2 is a block diagram illustrating an input buffer of FIG. 1 according to one embodiment.

Referring to FIG. 2, the input buffer 10 includes a current mode logic (CML) buffer 100 and a differential-to-single-ended converter 200.

The MCL buffer 100 receives first and second input signals IN+ and IN− to generate first and second differential output signals Out+ and Out− and a common output signal OutC having a middle level between levels of the first and second differential output signals Out+ and Out−. The first and second input signals IN+ and IN− may be a pair of differential signals or pseudo differential signals having an opposite phase. A signal level of the first and second differential output signals Out+ and Out− may be higher or lower than a signal level of the first and second input signals IN+ and IN−.

Figure 4:
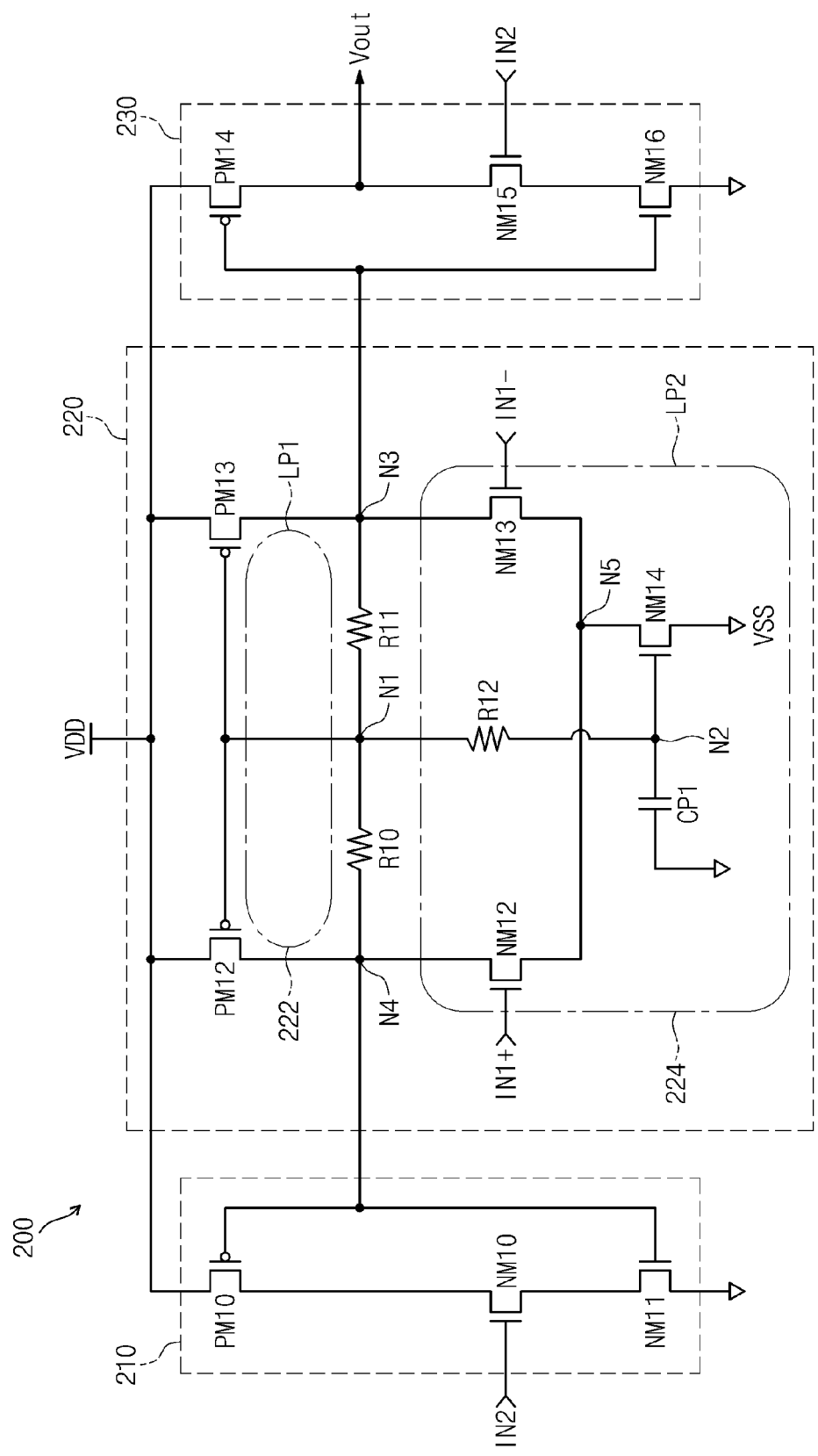
FIG. 4 is a circuit of self-biased a differential-to-single-ended convert of FIG. 2 according to one embodiment.

The differential-to-single-ended converter 200 receives the first and second differential output signals Out+ (=IN1+) and Out− (=IN1−) and an input selection signal IN2 to output a single ended output signal Vout. The differential-to-single-ended converter 200 may have a self-biased operation structure as illustrated in FIG. 4 and may be configured so that an internal control node N1 is controlled in a negative feedback method to maintain a constant duty ratio of the single ended output signal Vout regardless of the change of operation environment.

The input selection signal IN2 may be the common output signal OutC or a DC signal having a specific voltage level according to a switching operation of a switch 150. That is, when the switch 150 is switched into a first select terminal S1, the common output signal OutC is provided through a line L3 as the input selection signal IN2. When the switch 150 is switched into a second select terminal S2, the DC signal is provided as the input selection signal IN2. The first and second differential output signals Out+ (=IN1+) and Out− (=IN1−) are transmitted through lines L1 and L2.

Figure 3A:
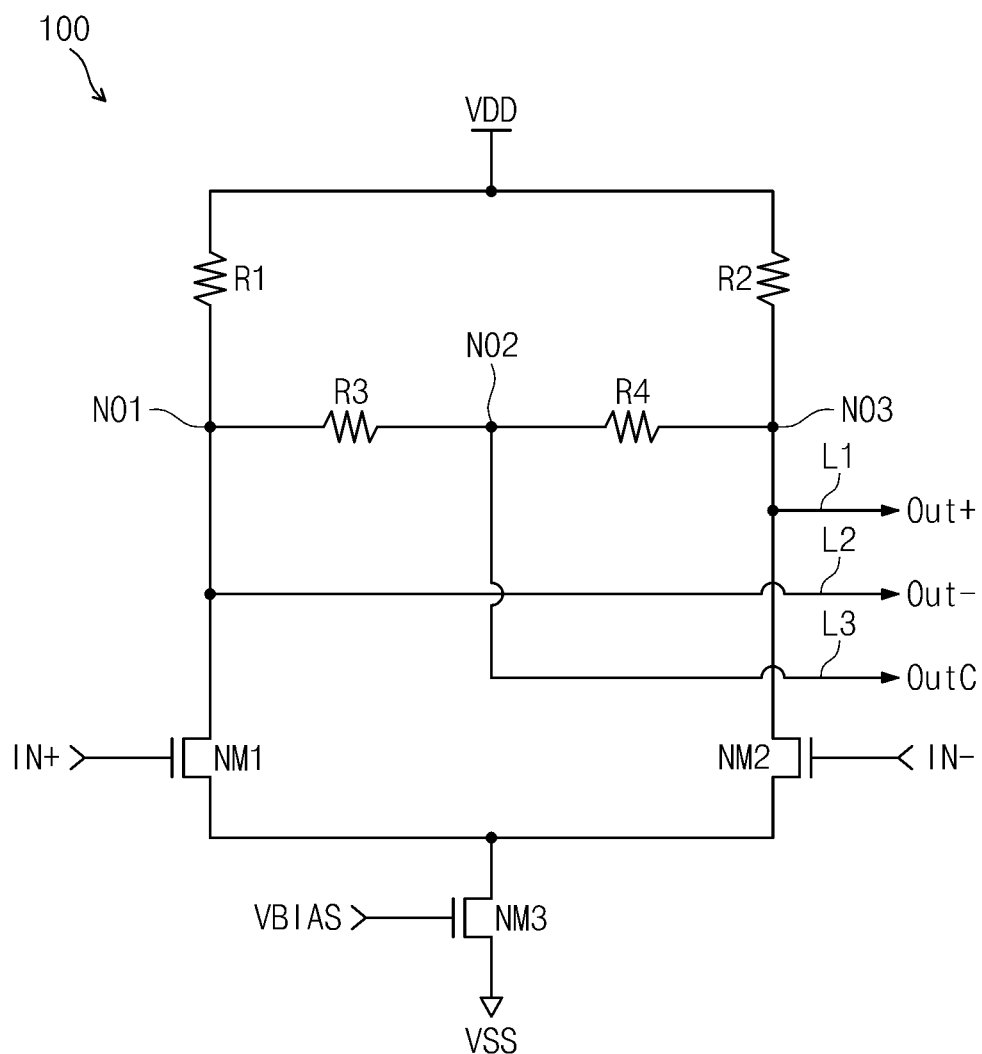
FIG. 3A is a circuit of CML buffer of FIG. 2 according to one embodiment.

FIG. 3A is a specific circuit of CML buffer of FIG. 2 according to one embodiment.

Referring to FIG. 3A, the CML buffer includes first and second resistors R1 and R2 of which one ends are connected to a power supply VDD respectively, third and fourth resistors of which one ends are connected to the other ends of the first and second resistors R1 and R2 respectively, first and second MOS transistors NM1 and NM2 of which drains are connected to the other ends of the first and second resistors R1 and R2 respectively and a third MOS transistor NM3 of which a drain-source channel is connected between a ground and a common source to which sources of the first and second MOS transistors NM1 and NM2 are connected and of which a gate receives a bias voltage VBIAS having a predetermined voltage level.

The first and second input signals IN+ and IN− are applied to gates of the first and second MOS transistors NM1 and NM2 respectively. The first differential output signal Out+ is provided from a connecting point NO3 at which the other end of the second resistor R2 and one end of the fourth resistor R4 are connected to each other. The second differential output signal Out− is provided from a connecting point NO1 at which the other end of the first resistor R1 and one end of the third resistor R3 are connected to each other. The common output signal OutC is provided from a connecting point NO2 at which the other ends of the third and fourth resistors R3 and R4 are connected to each other.

The first through fourth resistors R1 to R4 may be embodied by a passive device such as poly layer or metal layer or an active device such as a MOS structure. In FIG. 3A, the first and second MOS transistors NM1 and NM2 are embodied by an N_MOSFET but they may be embodied by P_MOSFET.

The circuit of FIG. 3A may minimize the duty distortion of single ended output signal Vout in addition by performing a current mode logic buffering operation. For example, when the first and second input signals IN+ and IN− are applied as pseudo differential signals, they are not real differential signals. Accordingly, the single ended output signal Vout generated from the differential-to-single-ended converter located at a back end may have a severe duty distortion. However, even when the first and second input signals IN+ and IN− are applied as pseudo differential signals, since the CML buffer 100 generates first and second differential output signals Out+ and Out− and a common output signal OutC having a level between levels of the first and second differential output signals Out+ and Out−. The common output signal OutC is connected to one input of a first inverting part 230 of FIG. 4 so that the first inverting part 230 may generate a single ended output signal Vout having a minimized duty distortion.

Figure 3B:
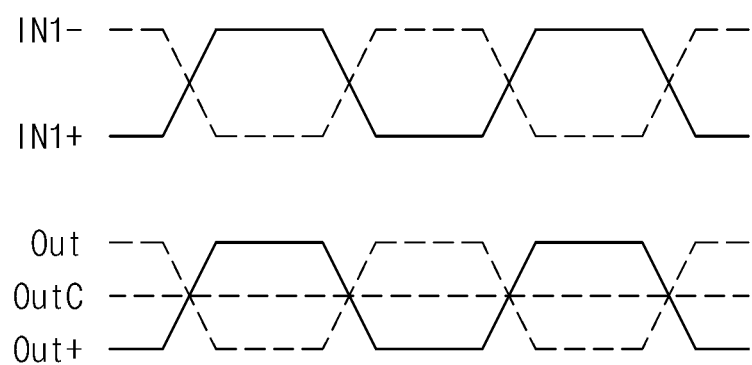
FIG. 3B is an example of waveforms for explaining a circuit operation of FIG. 3A according to one embodiment.

FIG. 3B is an example of waveforms for explaining a circuit operation of FIG. 3A according to an example embodiment.

Referring to FIG. 3B, the first and second input signals IN+ and IN− are applied to gates of the first and second MOS transistors NM1 and NM2 respectively. Waveforms of the first and second differential output signals Out+ and Out− are output at the connecting point NO3 and the connecting point NO1 in response to the first and second input signals IN+ and IN−, respectively. A waveform of the common output signal OutC is output at the connecting point NO2 at which the third and fourth resistors R3 and R4 are connected to each other. For example, each of third and fourth resistors R3 and R4 has the same amount of resistance. For example, a level of the common output signal OutC may have a level between the first differential output signals Out+ and second differential output signals Out− as shown in FIG. 3B. Particularly, the level of the common output signal OutC may have a middle level between an upper level of the first differential output signals Out+ and a lower level of the second differential output signals Out−. Although not shown in the FIG. 3B, the level of the common output signal OutC may fluctuate depend on the levels of the first and second differential output signals Out+ and Out−.

FIG. 4 is a circuit of self-biased a differential-to-single-ended convert of FIG. 2 according to one embodiment.

Referring to FIG. 4, the differential-to-single-ended converter 200 is configured so that an internal control node N1 is controlled in a negative feedback method to maintain a constant duty ratio of the single ended output signal Vout regardless of the change of operation environment such as a process, a voltage, or a temperature.

In FIG. 4, the differential-to-single-ended converter 200 includes a self-biased converting part 220 receiving the first and second differential output signals IN1+ and IN1− to generate a first internal output signal through a load device PM13 operating in a saturation region and a first inverting part 230 generating a single ended output signal Vout by inverting the first internal output signal in response to an input selection signal IN2. The input selection signal IN2 may be the common output signal OutC or a DC signal having a predetermined voltage level such as a power supply voltage VDD or VDD/2.

The differential-to-single-ended converter 200 may further include a second inverting part 210 as a dummy device inverting a second internal output signal in response to the input selection signal IN2.

The self-biased converting part 220 includes first and second MOS transistors PM12 and PM13 of which sources are connected to a power supply VDD, third and fourth MOS transistors NM12 and NM13 of which drains are connected to drains of the first and second MOS transistors PM12 and PM13, a fifth MOS transistor NM14 of which a channel is connected between a ground voltage VSS and a common source at which sources of the third and fourth MOS transistors NM12 and NM13 are connected to each other, a first resistor R10 connected between an internal control node N1 at which gates of the first and second MOS transistors PM12 and PM13 are connected to each other and the drain of the first MOS transistor PM12, a second resistor R11 connected between the internal control node N1 and the drain of the second MOS transistor PM13, a third resistor R12 connected between the internal control node N1 and a gate of the fifth MOS transistor NM14 and a capacitor CP1 connected between the gate of the fifth MOS transistor NM14 and the ground voltage VSS.

In one embodiment, the self-biased converting part 220 includes a pull-up part including first and second MOS transistors PM12 and PM13 of which sources are connected to a power supply VDD, an input part including third and fourth MOS transistors NM12 and NM13 of which drains are connected to drains of the first and second MOS transistors PM12 and PM13, a pull-down part including a fifth MOS transistor NM14 of which a channel is connected between a ground voltage VSS and a common source at which sources of the third and fourth MOS transistors NM12 and NM13 are connected to each other, and one or more resistors including a first resistor R10 connected between an internal control node N1 at which gates of the first and second MOS transistors PM12 and PM13 are connected to each other and the drain of the first MOS transistor PM12, a second resistor R11 connected between the internal control node N1 and the drain of the second MOS transistor PM13, a third resistor R12 connected between the internal control node N1 and a gate of the fifth MOS transistor NM14, and a capacitor CP1 connected between the gate of the fifth MOS transistor NM14 and the ground voltage VSS. The input part, for example, the third and fourth MOS transistors NM12 and NM13 of which gates receive the first and second differential output signals IN1+ and IN1−, respectively, generates a first internal output signal at a node N3 and generates a second internal output signal at a node N4. The first internal output signal is fed back to the internal control node N1 through the second resistor R11, and controls the pull-up part and the pull-down part so that a level of the first internal output signal is maintained a predetermined voltage level.

The first inverting part 230 includes sixth and seventh MOS transistors PM14 and NM16 of which gates are commonly connected to a first internal output node N3 which is the drain of the second MOS transistor PM13 and the drain of the fourth MOS transistor NM13, and an eighth MOS transistor NM15 of which a drain-source channel is connected between a drain of the sixth MOS transistor PM14 and a drain of the seventh MOS transistor NM16 and of which a gate receives the input selection signal IN2. The single ended output signal Vout is provided from the drain of the sixth MOS transistor PM14 and the drain of the eighth MOS transistor NM15.

The second inverting part 210 includes ninth and tenth MOS transistors PM10 and NM11 of which gates are connected to a second internal output node N4 which is the drain of the first MOS transistor PM12 in common and an eleventh MOS transistor NM10 of which a drain-source channel is connected between a drain of the ninth MOS transistor PM10 and a drain of the tenth MOS transistor NM11 and of which a gate receives the input selection signal IN2.

In FIG. 4, the first inverting part 230 has a replica structure of the MOS transistors PM13, NM13 and NM14 in the self-biased converting part 220. That is, the MOS transistors PM14, NM15 and NM16 in the first inverting part 230 have a structure corresponding to the MOS transistors PM13, NM13 and NM14 in the self-biased converting part 220 respectively. When the MOS transistor NM15 is not adopted, the replica structure is not formed and thereby a large duty distortion may occur. In that case, an accurate replica structure is not formed due to a gate delay. However, in case of FIG. 4, the common output signal OutC or the DC signal is applied to the gate of the MOS transistor NM15 to form a replica structure so that the single ended output signal Vout may minimize duty distortion.

The second inverting part 210 is a dummy circuit which is configured to have a symmetrical structure with the first inverting part 230 to reduce a variation of an operation of the self-biased converting part 220. Since an operation of the self-biased converting part 220 is balanced by adopting the dummy circuit, power consumption may also reduced.

The circuit of FIG. 4 is configured so that an internal control node is controlled by a negative feedback method to maintain a constant duty ratio of the single ended output signal regardless of the change of operation environment. First and second loops 222 and 224 provide a negative feedback effect. The first loop LP1 is a closed loop including the MOS transistors PM12 and PM13 and the resistors R10 and R11. The second loop LP2 is a closed loop including the MOS transistors NM12, NM13 and NM14 and resistors R10, R11 and R12.

Figure 6A:
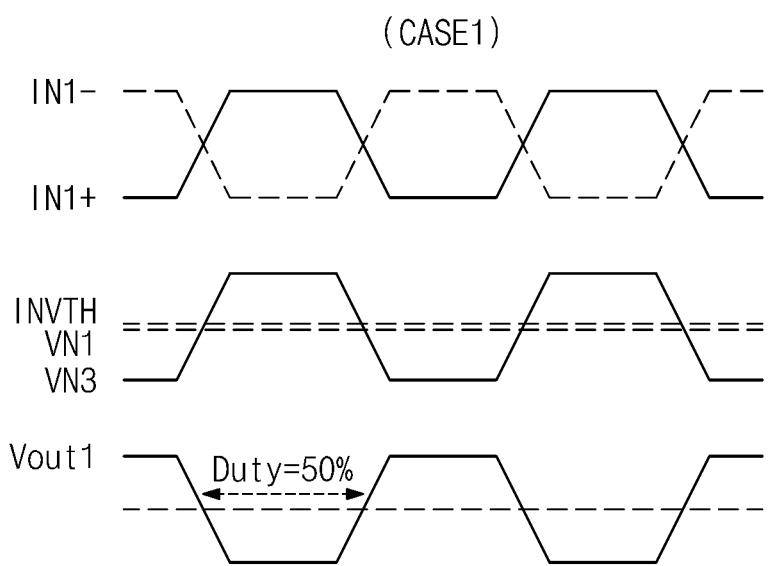
FIGS. 6A, 6B and 6C are waveforms for explaining a circuit operation of FIG. 4 according to example embodiments.
Figure 6A:
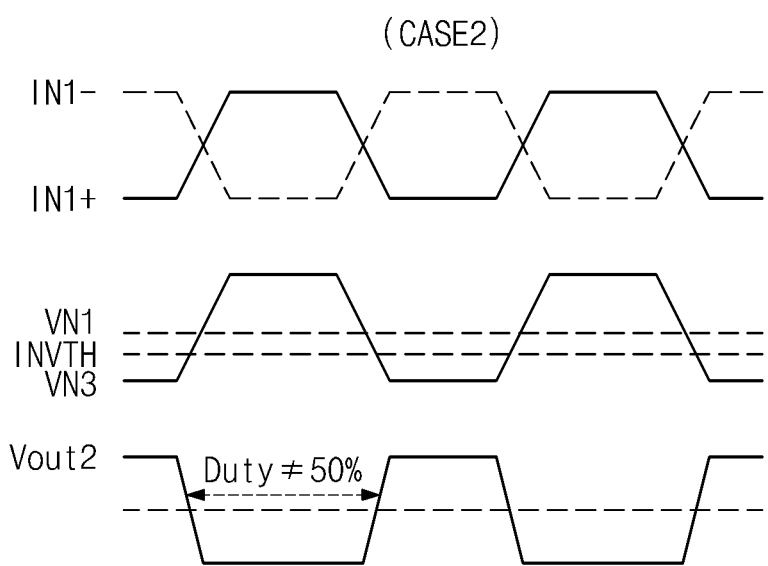
Figure 6B:
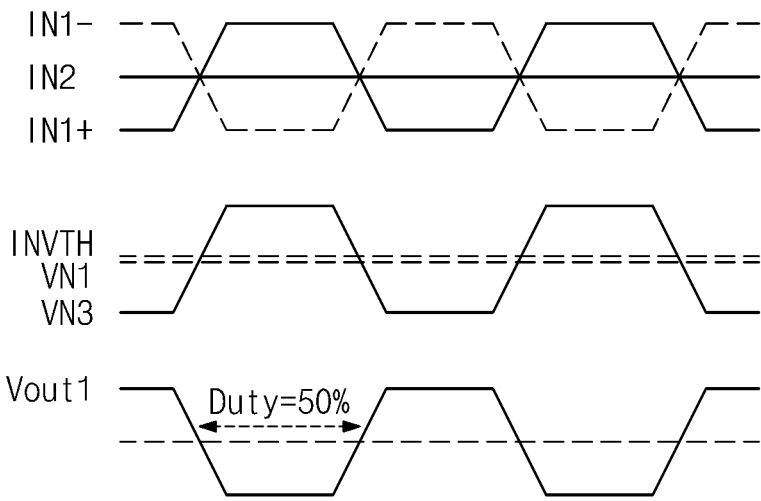
Figure 6B:
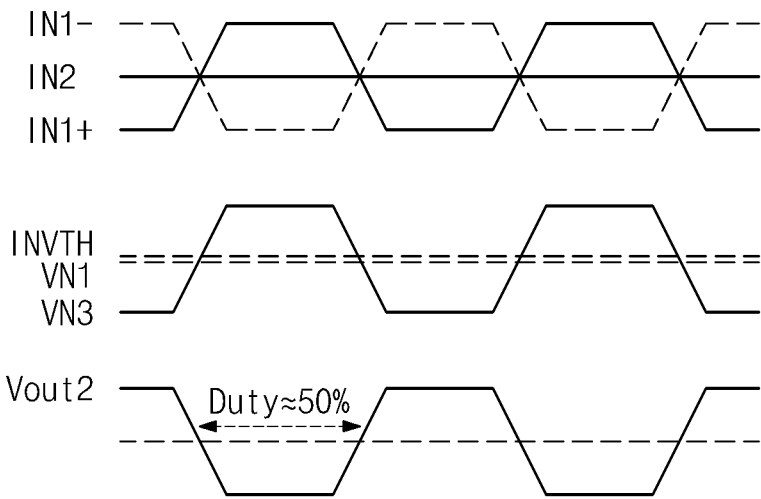
Figure 6C:
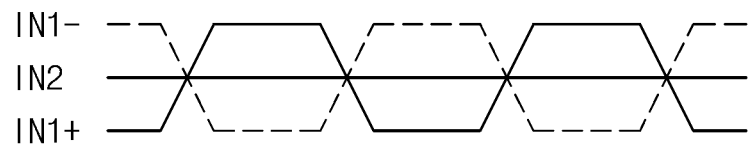
Figure 6C:
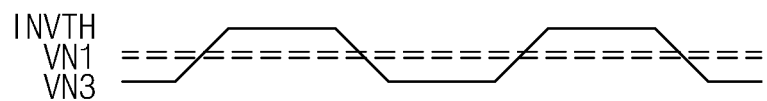
Figure 6C:
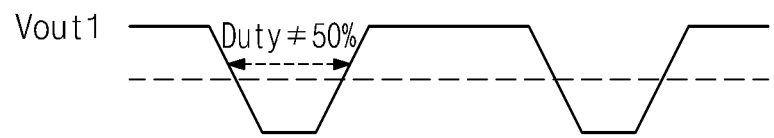
Figure 6C:
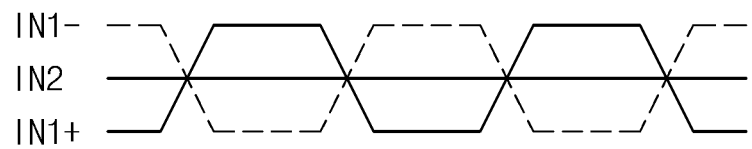
Figure 6C:
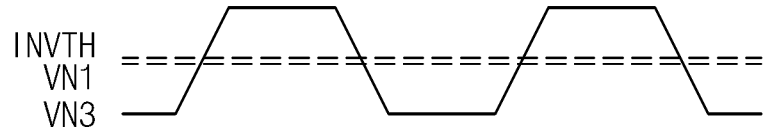
Figure 6C:
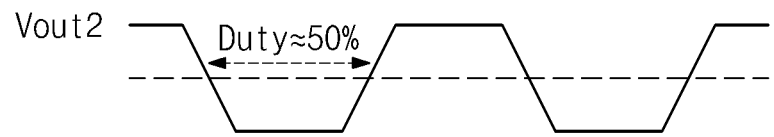

Differential signals such as waves IN1+ and IN1− of FIG. 6C may be applied to gates of the third and fourth MOS transistors NM12 and NM13. The first and second MOS transistors PM12 and PM13 may be biased to operate in a saturation region. For example, in FIG. 4, a target level of the first internal control node N1 is set to ½ VDD. A signal such as a waveform VN3 of FIG. 6C may be output from the first internal node N3. At this time, a level of threshold voltage of the first inverting part 230 is provided to be a waveform INVTH and the internal control node N1 may be set to a voltage level of waveform VN1.

When there is little change of operation environment, since a level difference between the waveform INVTH and the waveform VN1 is relatively small, a duty ratio of the single ended output signal Vout can be maintained to be 50% like a waveform Vout.

In case of the first loop, if the change of operation environment occurs and thereby a voltage level of the internal control node N1 is reduced, since a gate voltage of the first and second MOS transistors PM12 and PM13 is lowered, a load resistance of the first and second MOS transistors PM12 and PM13 is reduced. Also, since the first and second MOS transistors PM12 and PM13 operate in a saturation region, even if there is the change of drain-source voltage, there is little change of driving current. Thus, a swing level of the first internal output node N3 becomes insensitive to a change of operation environment such as power variation. If the load resistances of the first and second MOS transistors PM12 and PM13 are reduced, since the first and second MOS transistors PM12 and PM13 are more strongly turned on, a voltage level of the internal control node N1 increases. For example, in the case that a voltage level of the internal control node N1 is reduced, a negative feedback effect is performed to compensate the change of operation environment.

In contrast, in case of the first loop, if the change of operation environment occurs and thereby a voltage level of the internal control node N1 is increased, since a gate voltage of the first and second MOS transistors PM12 and PM13 is increased, a load resistance of the first and second MOS transistors PM12 and PM13 is increased. Also, since the first and second MOS transistors PM12 and PM13 operate in a saturation region, even if there is the change of drain-source voltage, there is little change of driving current. Thus, a swing level of the first internal output node N3 becomes insensitive to a change of operation environment such as power variation. If the load resistances of the first and second MOS transistors PM12 and PM13 are increased, since the first and second MOS transistors PM12 and PM13 are weakly turned on, a drive capacity is reduced. Thus, a voltage level of the internal control node N1 is reduced. In the case that a voltage level of the internal control node N1 is increased, a negative feedback effect may be performed to compensate the change of operation environment.

In case of the second loop, if the change of operation environment occurs and thereby a voltage level of the internal control node N1 is reduced, a voltage level of second internal control node N2 is also reduced. Since a gate voltage of the fifth MOS transistor NM14 is lowered, the amount of current flowing into a ground through the fifth MOS transistor NM14 is reduced. Thus, a voltage level of the first internal output node N3 is increased and a voltage level of the first internal control node N1 is also increased. That is, in the case that a voltage level of the internal control node N1 is reduced, a negative feedback effect is performed to compensate the change of operation environment.

In contrast, in case of the second loop, if the change of operation environment occurs and thereby a voltage level of the internal control node N1 is increased, a voltage level of second internal control node N2 is also increased. Since a gate voltage of the fifth MOS transistor NM14 is increased, the amount of current flowing into a ground through the fifth MOS transistor NM14 is increased. Thus, a voltage level of the first internal output node N3 is reduced and a voltage level of the first internal control node N1 is also reduced. That is, in the case that a voltage level of the internal control node N1 is increased, a negative feedback effect is performed to compensate the change of operation environment.

In the circuit of FIG. 4, a swing level of the first internal output node N3 becomes relatively large like the waveform VN3 of case 2 of FIG. 6B. Thus, even if a voltage of the internal control node N1 is changed by a PVT variation, a duty distortion of the single ended output signal Vout does not greatly occur. If the first and second MOS transistors PM12 and PM13 are biased to operate in a saturation region, even if there is the change of operation environment, a duty distortion of the single ended output signal Vout is reduced or minimized.

Figure 5:
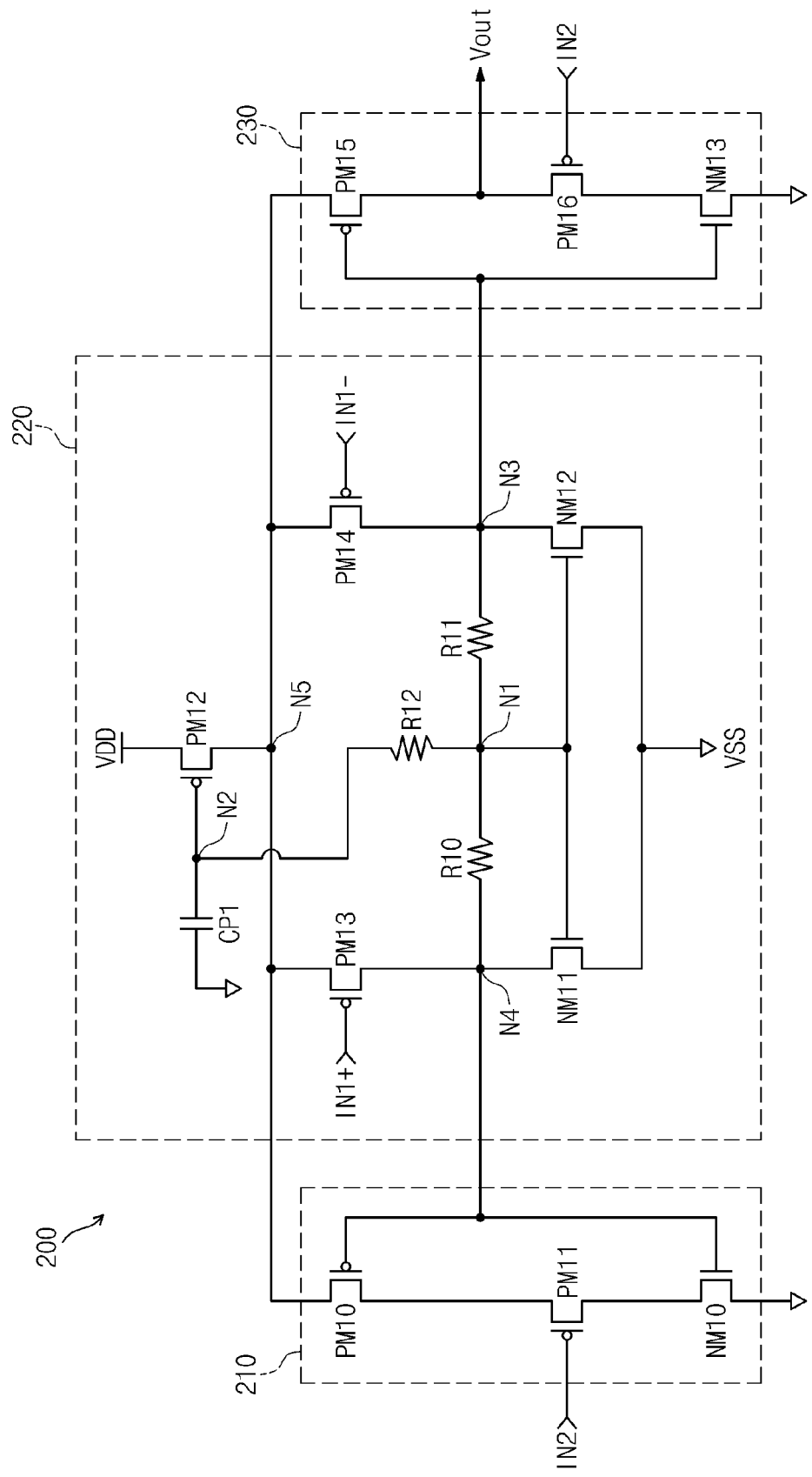
FIG. 5 is another circuit of self-biased a differential-to-single-ended convert of FIG. 2 according to one embodiment.

FIG. 5 is another circuit of self-biased a differential-to-single-ended convert of FIG. 2 according to one embodiment.

Referring to FIG. 5, similar to FIG. 4, the differential-to-single-ended converter 200 is configured so that an internal control node N1 is controlled in a negative feedback method to maintain a constant duty ratio of the single ended output signal Vout regardless of the change of operation environment.

In FIG. 5, the differential-to-single-ended converter 200 includes a self-biased converting part 220 receiving the first and second differential output signals IN1+ and IN1– to generate a first internal output signal through a load device PM14 operating in a saturation region and a first inverting part 230 generating a single ended output signal Vout by inverting the first internal output signal in response to an input selection signal IN2. The input selection signal IN2 may be the common output signal OutC or a DC signal having a predetermined voltage level such as a power supply voltage VDD or VDD/2.

The differential-to-single-ended converter 200 may further include a second inverting part 210 as a dummy device inverting a second internal output signal in response to the input selection signal IN2.

The self-biased converting part 220 includes first and second MOS transistors NM11 and NM12 of which sources are connected to a ground voltage VSS, third and fourth MOS transistors PM13 and PM14 of which drains are connected to drains of the first and second MOS transistors NM11 and NM12 respectively, a fifth MOS transistor PM12 of which a drain-source channel is connected between a common source N5 to which sources of the third and fourth MOS transistors PM13 and PM14 are connected and a power supply voltage VDD, a first resistor R10 connected between an internal control node N1 to which gates of the first and second MOS transistors NM11 and NM12 are connected and the drain of the first MOS transistor NM11, a second resistor R11 connected between the internal control node N1 and the drain of the second MOS transistor NM12, a third resistor R12 connected between the internal control node N1 and a gate of the fifth MOS transistor PM12, and a capacitor CP1 connected between the gate of the fifth MOS transistor PM12 and the ground voltage VSS.

The first and second differential output signals IN1+ and IN1– are applied to gates of the third and fourth MOS transistors PM13 and PM14 respectively.

The first inverting part 230 includes sixth and seventh MOS transistors PM15 and NM13 of which gates are connected to a first internal output node N3 which is the drain of the second MOS transistor NM12, and an eighth MOS transistor PM16 of which a source-drain channel is connected between drains of the sixth and seventh MOS transistors PM15 and NM13 and of which a gate receives the input selection signal IN2. The single ended output signal Vout is provided from the drain of the sixth MOS transistor PM15 and the drain of the eighth MOS transistor PM16.

The second inverting part 210 includes ninth and tenth MOS transistors PM10 and NM10 of which gates are connected to a second internal output node N4 which is the drain of the first MOS transistor NM11, and an eleventh MOS transistor PM11 of which a source-drain channel is connected between drains of ninth and tenth MOS transistors PM10 and NM10 and of which a gate receives the input selection signal IN2.

Similar to FIG. 4, the second inverting part 210 is a dummy circuit which is configured to have a symmetrical structure with the first inverting part 230 to reduce a variation of an operation of the self-biased converting part 220. Also, adopting the dummy circuit may contribute to reduction of power consumption.

An operation of FIG. 5 is the substantially same as that of FIG. 4.

FIGS. 6A, 6B and 6C are waveforms for explaining a circuit operation of FIG. 4 according to example embodiments.

FIG. 6B is an operation waveform in accordance with FIG. 4 represented in contrast with FIG. 6A and FIG. 6C comparatively shows a duty improvement when load devices operate in a saturation region.

Waveforms illustrated in a case 1 of FIG. 6A may be waveforms that appear when there is no change of a process, a voltage, or a temperature in a conventional differential-to-single-ended converter. That is, the case 1 of FIG. 6A illustrates waveforms that can appear in a conventional differential-to-single-ended converter in connection with FIG. 4.

In the case 1 of FIG. 6A, the first and second differential output signals IN1+ and IN1– are applied to gates of the third and fourth MOS transistors NM12 and NM13 respectively. A waveform VN3 is output at a node of conventional differential-to-single-ended converter corresponding to the first internal output node N3 of FIG. 4. At this time, a level of threshold voltage of the first inverting part 230 is a waveform INVTH and a voltage level of waveform VN1 is set at a node of conventional differential-to-single-ended converter corresponding to the internal control node N1. When there is little change of operation environment, since a level difference between the waveform INVTH and the waveform VN1 is relatively small, a duty ratio of the single ended output signal Vout1 can be maintained to be 50% like a waveform Vout1.

In a case 2 of FIG. 6A, when there is a relatively large change of operation environment, since a level difference between the waveform INVTH and the waveform VN1 is relatively great, it is difficult for a duty ratio of the single ended output signal Vout2 to be maintained to be 50% like a waveform Vout2. As the change of operation environment is severe, a level difference between the waveform INVTH and the waveform VN1 becomes greater and thereby a duty distortion becomes severe.

To reduce or minimize the problem of duty distortion, if a differential-to-single-ended converter is embodied by a circuit structure such as FIG. 4 or 5, a constant duty ratio of the single ended output signal Vout may be maintained regardless of the change of operation environment.

In a case 1 of FIG. 6B, waveforms are illustrated which are obtained from the circuit of FIG. 4 when there is a little change of operation environment. In a case 2 of FIG. 6B, waveforms are illustrated which are obtained from the circuit of FIG. 4 when there is the change of operation environment due to a process, a voltage, or a temperature change.

In the case 1 of FIG. 6B, the first and second differential signals IN1+ and IN1– are applied to gates of the third and fourth MOS transistors NM12 and NM13 of FIG. 4 respectively. The input selection signal IN2 such as a waveform IN2 is applied to the gate of the eighth MOS transistor NM15 of the first inverting part 230. The input selection signal IN2 may be the common output signal OutC or a DC voltage having a specific level such as a power supply voltage VDD or VDD/2. A target level of the internal control node N1 in FIG. 4 may be set to VDD/2. A waveform VN3 is output from the first internal output node N3. At this time, a level of threshold voltage of the first inverting part 230 is a waveform INVTH and the internal control node N1 is set to a voltage level of waveform VN1. When there is a little change of operation environment, since a level difference between the waveform INVTH and the waveform VN1 is relatively small, a duty ratio of the single ended output signal Vout1 can be maintained to be 50% like a waveform Vout1.

In case 2 of FIG. 6B, waveforms similar to the case 1 of FIG. 6B are obtained. That is, in FIG. 4, if the internal control node N1 is controlled by a negative feedback method and the first and second MOS transistors PM12 and PM13 operate in a saturation region, even if there is the change of operation environment, a level difference between the waveform INVTH and the waveform VN1 is not greatly increased as compared with the case 1 of FIG. 6B. Thus, a duty ratio of the single ended output signal Vout2 can be maintained to be 50% like a waveform Vout2.

In a case 1 of FIG. 6C, waveforms are illustrated which are obtained from the circuit of FIG. 4 when the first and second MOS transistors PM12 and PM13 operate in a triode region.

In a case 2 of FIG. 6C, waveforms are illustrated which are obtained from the circuit of FIG. 4 when the first and second MOS transistors PM12 and PM13 operate in a saturation region.

In the case 1 of FIG. 6C, a swing level of the first internal output node N3 becomes relatively small like a waveform VN3. Thus, even if a voltage of the internal control node N1 is changed just a little due to PVT variation, a duty distortion of the single ended output signal Vout1 may greatly occur due to a large amplify gain of the first inverting part 230.

In the case 2 of FIG. 6C, since the first and second MOS transistors PM12 and PM13 operate in a saturation region, a swing level of the first internal output node N3 relatively becomes great like a waveform VN3. Thus, even if a voltage of the internal control node N1 is changed due to PVT variation, a duty distortion of the single ended output signal Vout2 may not greatly occur. Consequently, if the first and second MOS transistors PM12 and PM13 are biased to operate in a saturation region, even if there is the change of operation environment, a duty distortion of single ended output signal Vout2 may be reduced or minimized.

Figure 7:
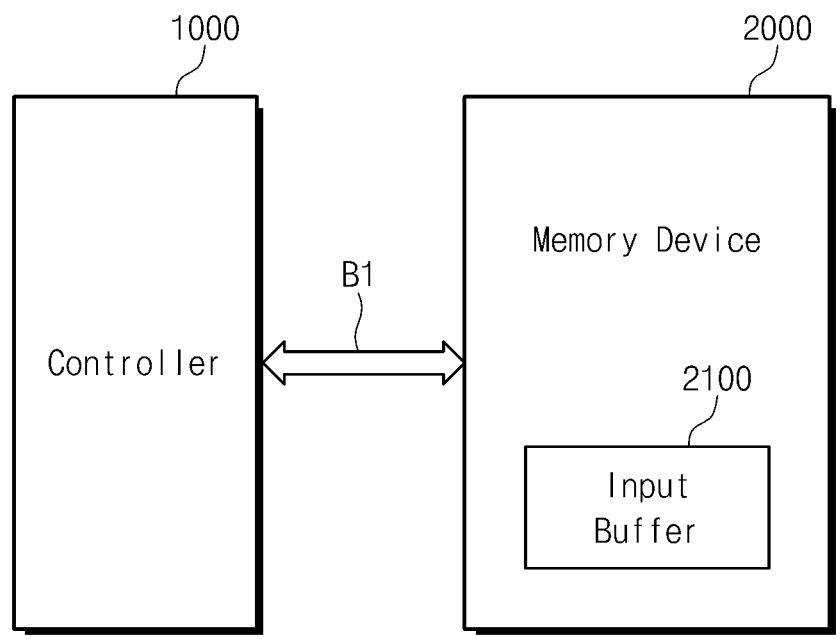
FIG. 7 is a block diagram illustrating an example embodiment of an application which is applied to a memory system.

FIG. 7 is a block diagram illustrating an example embodiment an application which is applied to a memory system.

Referring to FIG. 7, a memory system includes a controller 1000 and a memory device 2000. A bus B1 is in charge of a transmission of address, data and command between the controller 1000 and the memory device 2000.

The memory device 2000 may adopt an input buffer structure such as that of FIG. 2 as an input buffer 2100. In that case, even if there is the change of operation environment, the input buffer 2100 can provide a single ended output signal having a constant duty ratio. Thus, performance of the memory system may be improved and operation reliability may be improved.

Figure 8:
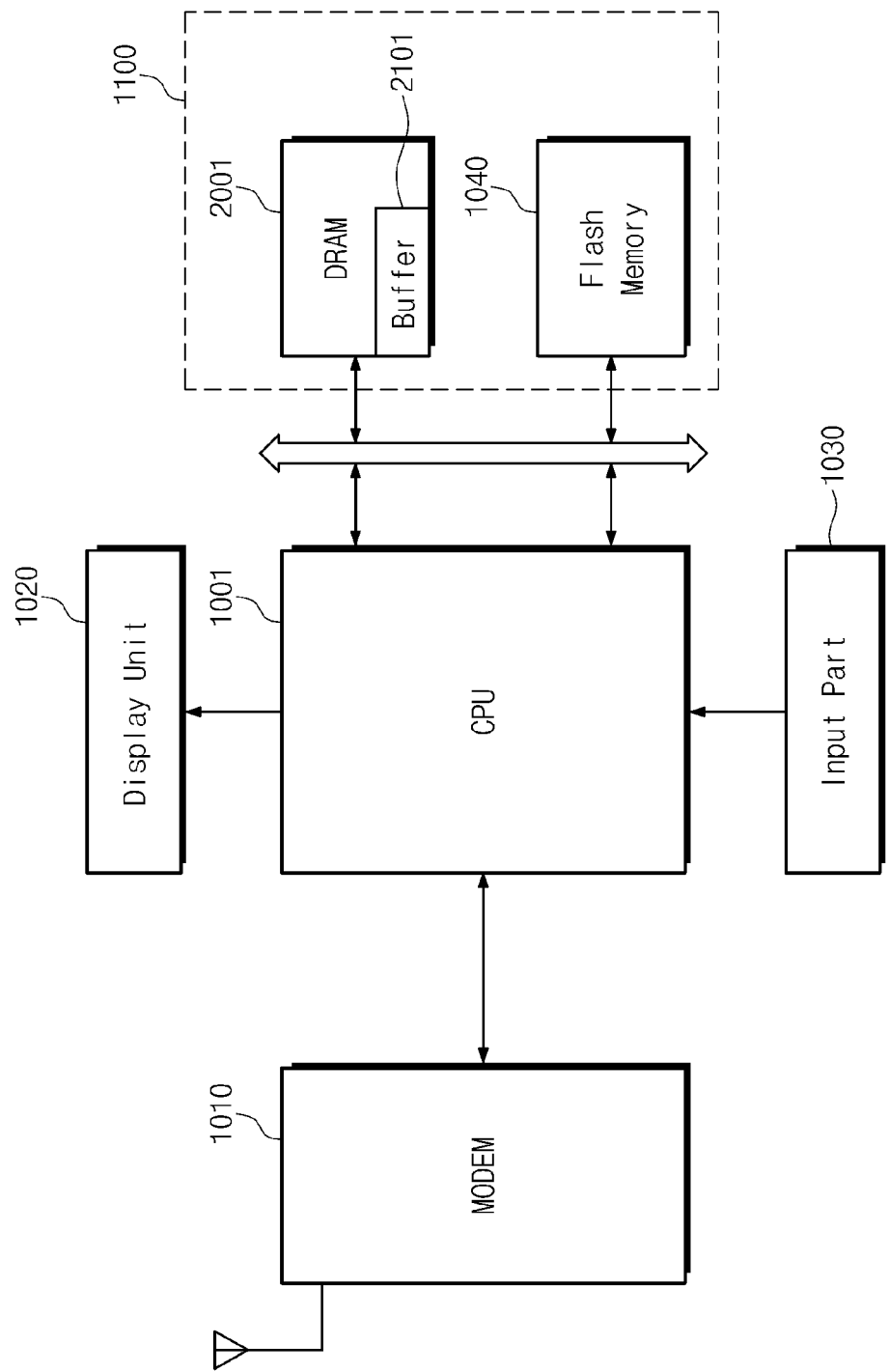
FIG. 8 is a block diagram illustrating an example embodiment of an application which is adopted in an electronic device.

FIG. 8 is a block diagram illustrating an example embodiment of an application which is adopted in an electronic device.

Referring to FIG. 8, an electronic device includes a modem 1010, a CPU 1001, a DRAM 2001, a flash memory 1040, a display unit 1020 and an input part 1030.

The CPU 1001, the DRAM 2001 and the flash memory 1040 may be manufactured or packaged in a single chip 1100. The DRAM 2001 adopts a buffer 2101 having a circuit structure such as FIG. 2.

The MODEM 1010 performs a modulation/demodulation function of communication data.

The CPU 1001 controls an overall operation of the electronic device according to the predetermined set program.

The DRAM 2001 functions as a main memory of the CPU 1001 and may be a synchronous DRAM.

The flash memory 1040 may be a NAND type flash memory.

The display unit 1020 is a liquid device having a backlight, a liquid device having a LED light source or an OLED device and may have a touch screen. The display unit 1020 functions as an output device displaying an image such as character, number or picture by a color.

The input part 1030 may be an input device including a numeral key, a functional key, etc. and performs an interface function between the electronic device and person.

The DRAM 2001 adopts a buffer circuit having a differential-to-single-ended converter such as FIG. 4 as the buffer 2101. Thus, even if there is the change of operation environment of a process, a voltage, a temperature, etc., a single ended output signal of the buffer is obtained as a signal having a reduced or minimized duty distortion. Thus, performance of the buffer circuit is improved and operation reliability is improved and thereby performance of the electronic device may become powerful.

The electronic device can function as a communication device or a smart card by adding and subtracting constituent elements if necessary.

The electronic device can be connected to an external communication device through an additional interface. The communication device may be a digital versatile disc (DVD), a player, a computer, a set top box, a game machine, a digital camcorder, etc.

Although not illustrated in the drawings, the electronic device may further include an application chip set, a camera image processor (CIS), a mobile DRAM, etc.

The chip 1100 can be mounted by various types of packages. For example, the chip 1100 can be mounted by various types of packages such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP) and wafer-level processed stack package (WSP).

In FIG. 8, a flash memory is adopted but a nonvolatile storage may be used.

The storage can store data information having various types of data such as text, graphic, software code, etc.

The storage may be embodied by, for example, an EEPROM, a flash memory, a MRAM, a spin-transfer torque MRAM, a conductive bridging RAM, a ferroelectric RAM, a PRAM called an ovonic unified memory, a resistive RAM, a nanotube RRAM, a polymer RAM, a nano floating gate memory, a holographic memory, a molecular electronics memory device, or an insulator resistance change memory.

According to some embodiments, a duty distortion of single ended output signal due to the change of operation environment such as a process, a voltage, or a temperature change may be reduced or minimized. Thus, performance of buffer circuit is improved and operation reliability may be improved.

The foregoing is illustrative of the example embodiments and is not to be construed as limiting thereof. Although a few embodiments have been described, those skilled in the art will readily appreciate that many modifications are possible in the embodiments without materially departing from the novel teachings and advantages of the present disclosure. Accordingly, all such modifications are intended to be included within the scope of the present disclosure as defined in the claims. The present disclosure is defined by the following claims, with equivalents of the claims to be included therein.

What is claimed is:

1. A buffer circuit comprising:
  a first buffer configured to receive first and second input signals and to generate first and second differential output signals and a common output signal, the common output signal having a level between an upper level of the first differential output signal and a lower level of the second differential output signal;

a second buffer configured to receive the first and second differential output signals and generate third and fourth differential output signals, wherein the third and fourth differential output signals are fed back to an internal control node of the second buffer to drive the third and fourth differential output signals from a first voltage level to a predetermined voltage level; and an inverter configured to receive the third differential output signal and generate an output signal.

2. The buffer circuit of claim 1, wherein the inverter is configured to generate the output signal in response to the common output signal or a voltage signal having a predetermined voltage level.

3. The buffer circuit of claim 1, wherein the first and second input signals are a pair of differential input signals having an opposite phase from each other.

4. The buffer circuit of claim 1, wherein the first and second input signals are pseudo differential input signals.

5. The buffer circuit of claim 1, wherein the first buffer comprises:

first and second resistors of which one ends are connected to a power supply voltage;

third and fourth resistors of which one ends are connected to the other ends of the first and second resistors respectively;

first and second MOS transistors of which drains are connected to the other ends of the first and second resistors respectively; and a third MOS transistor of which a drain-source channel is connected between a ground voltage and a common source to which sources of the first and second MOS transistors are connected and of which a gate receives a bias voltage, wherein the first and second input signals are applied to gates of the first and second MOS transistors respectively, the first differential output signal is provided from a connecting point to which the other end of the second resistor and one end of the fourth resistor are connected, the second differential output signal is provided from a connecting point to which the other end of the first resistor and one end of the third resistor are connected and the common output signal is provided from a connecting point to which the other ends of the third and fourth resistors are connected.

6. The buffer circuit of claim 1, wherein the second buffer comprises:

first and second MOS transistors of which sources are connected to a power supply voltage;

third and fourth MOS transistors of which drains are connected to drains of the first and second MOS transistors respectively;

a fifth MOS transistor of which a drain-source channel is connected between a ground voltage and a common source to which sources of the third and fourth MOS transistors are connected;

a first resistor connected between the internal control node to which gates of the first and second MOS transistors are connected and the drain of the first MOS transistor;

a second resistor connected between the internal control node and the drain of the second MOS transistor;

a third resistor connected between the internal control node and a gate of the fifth MOS transistor; and a capacitor connected between the gate of the fifth MOS transistor and a ground voltage, wherein the first and second differential output signals are connected to gates of the third and fourth MOS transistors respectively.

7. The buffer circuit of claim 6, wherein the first and second MOS transistors are configured to operate in a saturation region.

8. The buffer circuit of claim 6, wherein the inverter comprises:

sixth and seventh MOS transistors of which gates are connected to a first internal output node which is the drain of the second MOS transistor; and an eighth MOS transistor of which a drain-source channel is connected between a drain of the sixth MOS transistor and a drain of the seventh MOS transistor and of which a gate receives the common output signal or a predetermined voltage signal.

9. An input buffer comprising:

a current mode logic buffer configured to receive first and second input signals and to generate first and second differential output signals and a common output signal, the common output signal having a level between levels of the first and second differential output signals; and a differential-to-single-ended converter including a self-biased converting part configured to receive the first and second differential output signals and to generate a first internal output signal through a load device, and an inverting part configured to generate a single ended output signal by inverting the first internal output signal, wherein the first internal output signal is fed back to an internal control node to drive the first internal output signal from a first voltage level to a predetermined voltage level.

10. The input buffer of claim 9, wherein the inverting part is configured to generate the single ended output signal in response to the common output signal having a middle level between levels of the first and second differential output signals or a voltage signal having a predetermined voltage level.

11. The input buffer of claim 10, wherein the first and second input signals are a pair of differential input signals having an opposite phase from each other.

12. The input buffer of claim 11, wherein the current mode logic buffer comprises:

first and second resistors of which one ends are connected to a power supply voltage;

third and fourth resistors of which one ends are connected to the other ends of the first and second resistors respectively;

first and second MOS transistors of which drains are connected to the other ends of the first and second resistors respectively; and a third MOS transistor of which a drain-source channel is connected between a ground voltage and a common source to which sources of the first and second MOS transistors are connected and of which a gate receives a bias voltage, wherein the first and second input signals are applied to gates of the first and second MOS transistors respectively, the first differential output signal is provided from a connecting point to which the other end of the second resistor and one end of fourth resistor are connected, the second differential output signal is provided from a connecting point to which the other end of the first resistor and one end of the third resistor are connected and the common output signal is provided from a connecting point to which the other ends of the third and fourth resistors are connected.

13. The input buffer of claim 12, wherein the self-biased converting part comprises:

first and second MOS transistors of which sources are connected to a power supply voltage;

third and fourth MOS transistors of which drains are connected to drains of the first and second MOS transistors respectively;

a fifth MOS transistor of which a drain-source channel is connected between a ground voltage and a common source to which sources of the third and fourth MOS transistors are connected;

a first resistor connected between the internal control node to which gates of the first and second MOS transistors are connected and the drain of the first MOS transistor;

a second resistor connected between the internal control node and the drain of the second MOS transistor;

a third resistor connected between the internal control node and a gate of the fifth MOS transistor; and a capacitor connected between the gate of the fifth MOS transistor and a ground voltage, wherein the first and second differential output signals are connected to gates of the third and fourth MOS transistors respectively.

14. The input buffer of claim 13, wherein the inverting part comprises:

sixth and seventh MOS transistors of which gates are connected to a first internal output node which is the drain of the second MOS transistor; and an eighth MOS transistor of which a drain-source channel is connected between a drain of the sixth MOS transistor and a drain of the seventh MOS transistor and of which a gate receives the common output signal, wherein the single ended output signal is provided from the drain of the sixth MOS transistor and the sixth, seventh and eighth MOS transistors have a replica structure corresponding to the second, fifth and fourth MOS transistors respectively.

15. An input buffer circuit comprising:

a first buffer configured to generate a first pair of differential output signals in response to a first pair of differential input signals;

a second buffer including an input part, a pull-up part, and a pull-down part and configured to generate a second pair of differential output signals in response to the first pair of differential output signals through the input part, the second pair of differential output signals fed back to the pull-up part and pull-down part through one or more resistors; and an inverter configured to generate an output signal in response to one of the second pair of differential output signals.

16. The input buffer of claim 15, wherein the first buffer is further configured to generate a first common output signal having a level between levels of the first pair of differential output signals, the first common output signal generated from a first common output node.

17. The input buffer circuit of claim 16, wherein the inverter is configured to generate the output signal in response to the common output signal having a middle level between levels of the first pair of differential output signals or a voltage signal having a predetermined voltage level.

18. The input buffer of claim 15, wherein the one or more resistors comprise:

a first resistor configured to receive one of the first pair of differential output signals at a first end of the first resistor; and a second resistor configured to receive the other of the first pair of differential output signals at a first end of the second resistor, wherein second ends of the first and second resistors are connected to the first common output node.

19. The input buffer of claim 15, wherein the second buffer is further configured to generate a second common output signal having a middle level between levels of the second pair of differential output signals, the second common output signal directly connected to the pull-up part and generated from a second common output node of the second buffer.

20. The input buffer of claim 19, wherein the one or more resistors comprise:

a third resistor configured to receive one of the second pair of differential output signals at a first end of the third resistor; and a fourth resistor configured to receive the other of the second pair of differential output signals at a first end of the fourth resistor, wherein second ends of the third and fourth resistors are connected to the second common output node.

* * * * *